US006549470B2

(12) United States Patent
Hardee et al.

(10) Patent No.: US 6,549,470 B2
(45) Date of Patent: Apr. 15, 2003

(54) SMALL SIGNAL, LOW POWER READ DATA BUS DRIVER FOR INTEGRATED CIRCUIT DEVICES INCORPORATING MEMORY ARRAYS

(75) Inventors: Kim Carver Hardee, Colorado Springs, CO (US); Michael Curtis Parris, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 09/932,331

(22) Filed: Aug. 17, 2001

(65) Prior Publication Data

US 2002/0136051 A1 Sep. 26, 2002

Related U.S. Application Data

(60) Provisional application No. 60/229,233, filed on Aug. 31, 2000.

(51) Int. Cl.$^7$ ................................................ G11C 16/04
(52) U.S. Cl. ............................ 365/189.05; 365/230.06; 365/230.08
(58) Field of Search ........................ 365/189.05, 230.06, 365/230.08, 190, 205, 196

(56) References Cited

U.S. PATENT DOCUMENTS

| RE35,154 E | 2/1996 | Hardee | 365/189.09 |
|---|---|---|---|
| 5,680,362 A | 10/1997 | Parris et al. | 365/230.01 |
| 5,910,919 A * | 6/1999 | Sharma et al. | 365/189.05 |
| 6,088,270 A | 7/2000 | Hardee | 365/189.05 |
| 6,111,801 A * | 8/2000 | Brady | 365/200 |
| 6,208,574 B1 | 3/2001 | Hardee | 365/205 |
| 6,249,469 B1 | 6/2001 | Hardee | 365/205 |
| 6,262,935 B1 | 7/2001 | Hardee | 365/230.06 |
| 6,266,266 B1 | 7/2001 | Hardee | 365/63 |
| 6,275,432 B1 | 8/2001 | Hardee | 365/205 |
| 6,278,653 B1 | 8/2001 | Hardee | 365/233 |

* cited by examiner

*Primary Examiner*—David Lam
(74) *Attorney, Agent, or Firm*—William J. Kubida; Peter J. Meza; Hogan & Hartson LLP

(57) ABSTRACT

A small signal, low power read data bus driver for integrated circuit devices incorporating memory arrays which advantageously utilizes non-precharged data lines and reduced output voltage swing to reduce power requirements, tri-stateable outputs to allow several circuits to be multiplexed on the same data line and provides a buffer between the sense amplifier and the data lines to improve data line switching speed.

14 Claims, 3 Drawing Sheets

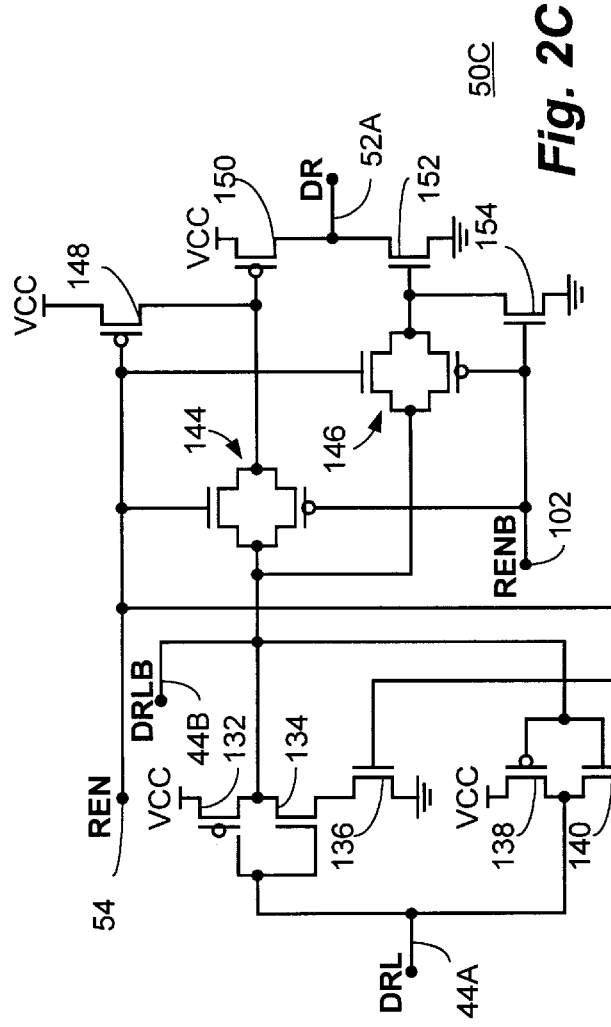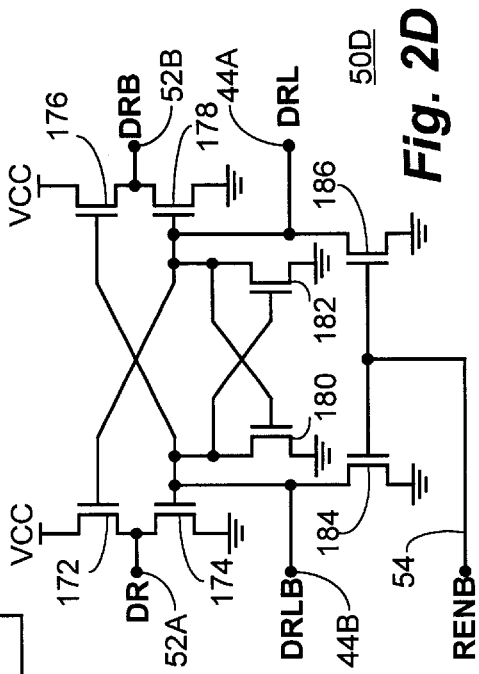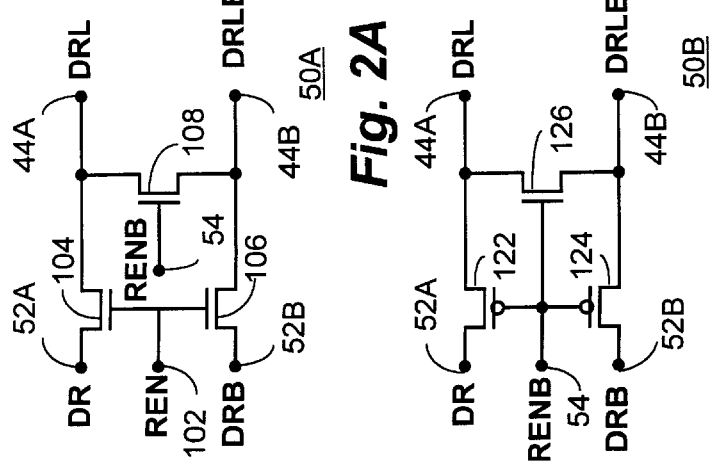

SMALL SIGNAL, LOW POWER READ DATA BUS DRIVER FOR INTEGRATED CIRCUIT DEVICES INCORPORATING MEMORY ARRAYS

CROSS REFERENCE TO RELATED PATENT APPLICATIONS

The present application claims priority based upon U.S. Provisional Patent Application No. 60/229,233, filing date Aug. 31, 2000 the disclosure of which is hereby specifically incorporated herein by this reference. Further, the present application is related to the disclosure of previously filed patent application Ser. No. 09/595,143 for: "Architecture for High Speed Memory Circuit Having a Relatively Large Number of Internal Data Lines", the disclosure of which is also incorporated herein by reference.

BACKGROUND OF THE INVENTION

The present invention relates, in general, to the field of integrated circuit devices incorporating memory arrays. More particularly, the present invention is related to a small signal, low power "read" data bus driver for integrated circuit memory devices incorporating dynamic random access memory ("DRAM") arrays.

Integrated circuit DRAM chips are large, rectangular arrays of memory cells with support logic used for reading and writing data into the arrays, and refresh circuitry used to maintain the integrity of the stored data. Memory arrays are arranged in rows and columns of memory cells connected to word lines and bit lines. Each memory cell has a unique location or address defined by the intersection of a row line and a bit line.

A single DRAM memory cell is typically a capacitor and pass transistor wherein the capacitor is charged to produce a logic one or discharged to produce a logic zero. An integrated circuit memory chip includes support circuitry that allows the user to read the data stored in the memory's cells, write to the memory cells, and refresh the memory cells. This supporting circuitry generally includes sense amplifiers that are used to amplify the signal or charge detected in a memory cell, address logic to select specific rows and columns of memory, row address select and column address select logic used to latch and resolve the row and column addresses and to initiate and terminate read and write operations, read and write circuitry to store information in the memory's cells or to read stored data, internal counters or registers to keep track of the refresh sequence, or to initiate refresh cycles as need, and output enable logic used to prevent data from appearing at the outputs unless specifically desired.

The "read data path" circuitry of a DRAM chip typically includes global read data lines, a read amplifier, and a sense amplifier coupled to the bit lines. In prior art read data paths the global read data lines are coupled directly to the read amplifier. The read data lines must typically be pre-charged and have a voltage swing between ground or VSS and the full VCC power level. This manner of operation wastes power or, alternatively, reduces data line switching speed for a given power rating.

What is desired, therefore, is read path circuitry for an integrated circuit DRAM in which pre-charging of the read data lines is not necessary, power is reduced, and read data line switching speed is improved.

SUMMARY OF THE INVENTION

Disclosed herein is a small signal, low power "read" data bus driver for integrated circuit devices incorporating memory arrays which serves to reduce power requirements by not precharging the read data lines and by reducing the voltage swing on the read data lines. In a representative embodiment, a push-pull driver stage in a local read data driver ("LRDD") is used between the complementary local read data lines ("DRL", "DRLB") and the global read data lines ("DR", "DRB") to eliminate the need to precharge the global read data lines. The LRDD drives the global read data lines between circuit ground (VSS) and a threshold voltage below the supply voltage level (VSS-Vtn) which reduces the voltage swing on these lines. The elimination of the pre-charge operation and the reduced voltage swing both serve to reduce the power consumption of the device. Advantageously, the LRDD also serves to buffer the memory array read amplifier in the sense amplifier from the global read data lines.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 2A through 2D are various alternative implementations for the local read data driver ("LRDD") illustrated in the preceding figure;

DESCRIPTION OF A REPRESENTATIVE EMBODIMENT

Figure 1:
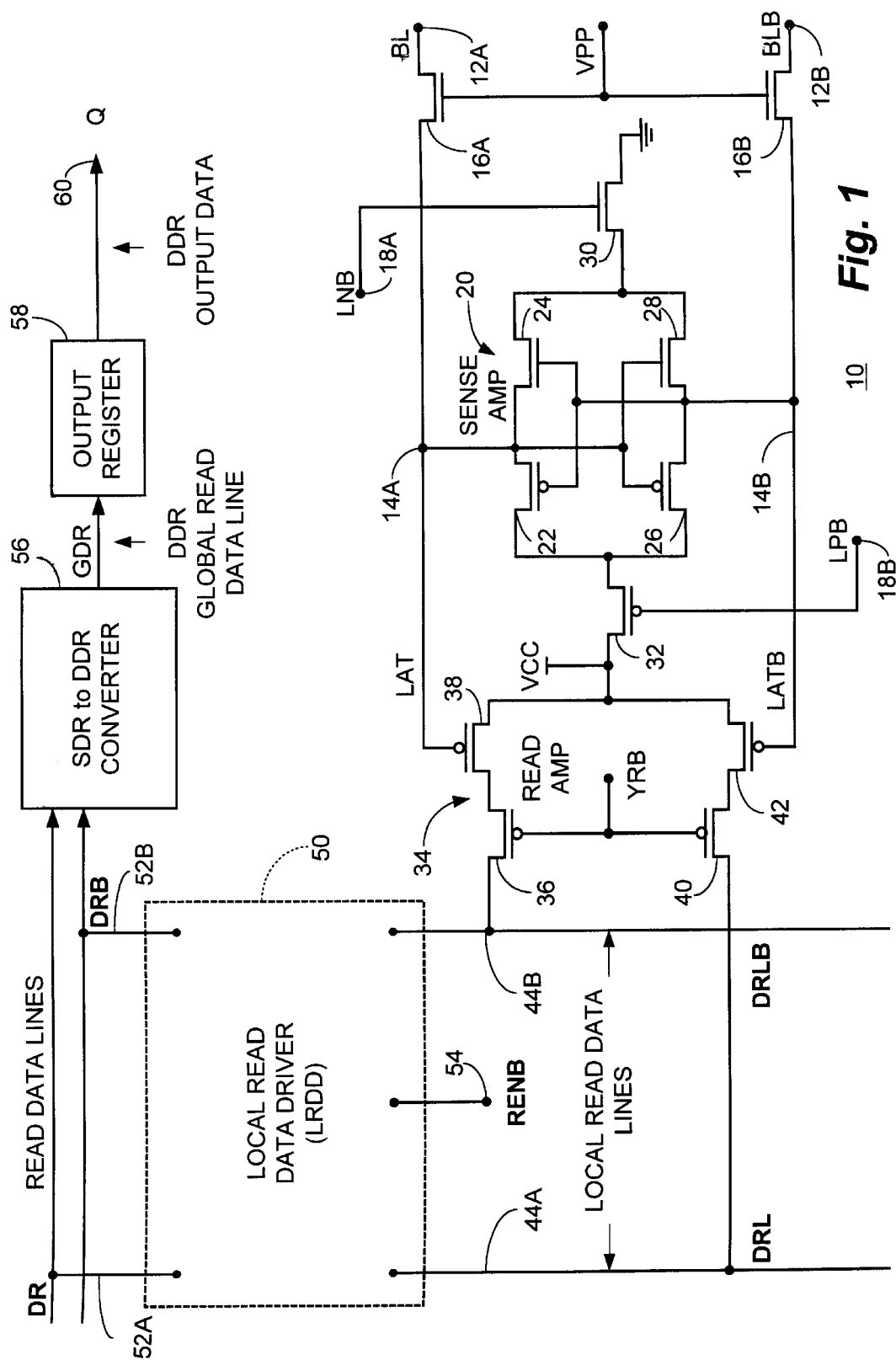
FIG. 1 is a schematic and block diagram illustration of an exemplary implementation of a read data path in accordance with an embodiment of the present invention for use in conjunction with an embedded dynamic random access memory ("DRAM") macro.

With reference now to FIG. 1, a schematic and block diagram illustration of an exemplary implementation of a read data path 10 in accordance with an embodiment of the present invention is shown for use, for example, in conjunction with an embedded dynamic random access memory ("DRAM").

The read data path 10 is coupled to the complementary bit line pairs 12A and 12B ("BL" and "BLB") of, for example, a DRAM macro or other memory array. A pumped control voltage, VPP, which may be set equal to approximately two times a supply voltage VCC, is applied to the gates of respective pass transistors, 16A and 16B to couple the complementary bit lines 12A and 12B to the latched bit line (LAT) node 14A and complementary latched bit line (LATB) node 14B respectively. The pass transistors 16A and 16B serve to effectively isolate the relatively high capacitance on the bit lines 12A and 12B from the LAT and LATB nodes 14A and 14B. This then allows the nodes 14A and 14B to be driven quickly during a "write" operation while concomitantly allowing these nodes to move quickly during sensing, thereby increasing speed during a "read" operation. The pass transistors 16A and 16B are "on" in a continuous manner and effectively serve as resistive paths between the bit lines 12A and 12B and the corresponding nodes 14A and 14B. In an alternative embodiment, the pass transistors 16A and 16B may be replaced by resistors or depletion mode transistors. By way of comparison, if the pass transistors 16A and 16B had to be switched "on" and "off", or the gate voltages applied varied between different levels to control sensing and/or write speed, more current would be required from the pumped VPP voltage source.

As illustrated, a sense amplifier 20 is coupled between the LAT and LATB nodes 14A and 14B. The sense amplifier comprises a pair of series coupled P-channel and N-channel transistors 22, 24 and 26, 28 coupled in parallel to form a standard cross-coupled latch. The gates of transistors 22, 24 are coupled to the LATB node 14B while the gates of transistors 26, 28 are coupled to the LAT node 14A. The common connected terminals of transistors 24 and 28 are coupled to circuit ground through an N-channel transistor 30 which receives a signal LNB at the gate terminal 18A thereof. In like manner, the common connected terminals of transistors 22 and 26 are coupled to a supply voltage VCC through a P-channel transistor 32 which receives a signal LPB at the gate terminal 18B thereof.

A read amplifier 34 comprising a pair of series connected P-channel transistors 36, 38 and 40, 42 is also illustrated. Common connected terminals of transistors 38 and 42 are also coupled to the supply voltage VCC while their respective gate terminals are coupled to the LAT and LATB nodes 14A and 14B. The gate terminals of transistors 36 and 40 are coupled together to receive an active "low" YRB signal. Transistor 36 is also coupled to local read data line 44B ("DRLB") while transistor 40 is coupled to the local read data line 44A ("DRL"). It should be noted that a typical read amplifier may typically utilize N-channel devices instead of the P-channel transistors 36 through 42 shown.

A read data amplifier 34 is associated with each sense amplifier 20 and it functions to pull up the local data read lines 44A, 44B when the signal YRB goes "low", depending on the levels on LAT and LATB nodes 14A and 14B. When a "read" operation is not occurring, DRL and DRLB lines 44A and 44B are held at circuit ground level (VSS) by the local read data driver 50. In a particular implementation, the local read data DRL and DRLB lines 44A and 44B are shared by eight sense amplifiers 20 and each has a unique YRB signal input.

The complementary local read data lines 44A and 44B serve as inputs to a local read data driver ("LRDD") 50 as indicated by the dashed box. Various alternative implementations of the local read data driver 50 will be described in more detail hereinafter. The local read data driver 50 also receives a read enable bar ("RENB") on line 54 and/or a complementary read enable ("REN") signal as will also be more fully described below. Output of the local read data driver 50 is furnished to complementary read data lines 52A and 52B ("DR" and "DRB") which switch at clock frequency (SDR) during a "read" cycle. These lines are coupled to a single data rate-to-double data rate ("SDR to DDR") converter 56 to provide a DDR signal ("GDRB") to the device global read data lines. These global read data lines are then supplied through an output register and buffer 58 to provide a DDR data output signal ("Q") on bus 60 at two times the clock frequency. Since the GDRB lines switch at DDR rates, there are ½ the number of lines compared to that which would be required at SDR rates. In the layout of a device in accordance with the present invention, this makes it possible to run these lines across the 2 Meg blocks comprising the 16 Meg macro with sufficient spacing to provide lower capacitance and lower power operation.

In the particular implementation of the read data path 10 illustrated, it may be used in conjunction with a 16 Mb DRAM macro. In this implementation, local read data drivers 50 are used instead of pass gates in order to achieve low power and high speed operation during "read" cycles. The local read data drivers 50 may, in a preferred embodiment, comprise a tri-stateable NMOS push-pull differential driver with a control input signal RENB (and/or REN) on line 54. Each local read data driver 50 has, as inputs, a pair of local read data lines 44A, 44B ("DRL", "DRLB") and serves to drive a pair of read data lines 52A and 52B ("DR", "DRB"). The read data DR/DRB lines 52A, 52B are connected to eight local read data driver circuits 50 in a 2 Meg block of a 16 Meg macro. The local read data DRL/DRLB lines are shared by eight sense amplifiers 20 with PMOS read amplifiers 34 driving the local read data DRL/DRLB lines 44A and 44B.

The local read data drivers 50 reduce power requirements by reducing capacitance and signal swing on the nonprecharged DR/DRB lines 52A and 52B. Eliminating precharge on the single data rate DR/DRB lines 52A, 52B is important because, when the DDR data lines are switching at full rate, the SDR data lines are not switching. If the SDR data lines are switching at full rate, then the DDR data lines are switching at one half rate. Overall operational speed is also improved because the local read data drivers 50 act as a low impedance buffer between the read amplifier 34 and the DR/DRB lines 52A, 52B. In a representative implementation of a read data path 10 in accordance with the present invention, the addition of the local read data drivers 50 to the design added approximately 3.4% to the overall on-chip area required to implement the 16 Meg macro.

With reference additionally now to FIGS. 2A through 2D, various alternative implementations for the local read data driver ("LRDD") 50 illustrated in FIG. 1 are shown. The purpose of the local read data driver 50 is to effectively buffer the read amplifier 34 and the sense amplifiers 20 from the relatively large capacitance on the DR, DRB lines 52A and 52B and to act as a multiplexer between the DR, DRB lines 52A, 52B and the DRL, DRLB lines 44A and 44B. In a particular implementation, there may be eight local read data drivers 50 connected to a pair of read data DR, DRB lines 52A and 52B, with only one of the local read data drivers 50 being activated at a time. In essence, the capacitance on the DR, DRB lines 52A and 52B is reduced because they are not connected directly to the DRL, DRLB lines 44A and 44B.

With reference specifically to FIG. 2A, a representative implementation of a local read data driver 50A is shown. The local read data driver 50A includes a pair of N-channel transistors 104 and 106 coupling the local read data lines 44A and 44B to the read data lines 52A and 52B respectively. The gate terminals of the transistors 104, 106 are coupled together to receive a REN signal on line 102 while the local read data lines 44A and 44B are coupled together by means of an N-channel transistor 108 having its gate terminal to receive the complementary RENB signal on line 54.

In this implementation, lines 44A or 44B is pulled low (when instead using N channel devices in the read amp 34) and the REN signal on line 102 goes "high" to turn on the transistors 104 and 106 to transfer data from the DRL and DRLB lines 44A and 44B to the DR and DRB lines 52A and 52B. The RENB signal on line 54 goes high to turn on transistor 108 to equalize the DRL and DRLB lines 44A, 44B when not reading. In a particular implementation of the present invention, either the DR or DRB line 52A, 52B is pulled "low" during a "read" cycle and is precharged "high" (to a level of VCC) before the next "read" cycle.

With reference specifically to FIG. 2B, another representative implementation of a local read data driver 50B is shown. The local read data driver 50B is similar to the previous implementation but instead utilizes a pair of P-channel transistors 122 and 124 coupling the local read data lines 44A and 44B to the read data lines 52A and 52B respectively. The gate terminals of the transistors 122, 124 are coupled together to receive the RENB signal on line 54 while the local read data lines 44A and 44B are coupled together by means of an N-channel transistor 126 which also has its gate terminal coupled to line 54.

An implementation utilizing P-channel devices in conjunction with P-channel devices in the read amplifier 34 is shown in FIG. 1. Although P-channel transistors are shown in the read amplifier 34 of FIG. 1, N-channel transistors are preferably used in this implementation. In the former instance, the DR and DRB lines 52A, 52B are precharged "low" and then either the DR line 52A or DRB line 54B is pulled "high" during a "read" cycle. In the latter instance, the DR and DRB lines 52A, 52B are precharged "high" and either of them would be pulled "low" during a "read" cycle. Since, in this embodiment of the local read data driver 50B, the transistors 122 and 124 are P-channel devices, the DR and DRB lines 52A, 52B can only be pulled to a threshold voltage (Vt) above VSS thereby limiting the voltage swing on DR and DRB lines 52A, 52B and saving power.

With respect to the foregoing embodiments of a local read data driver 50A (FIG. 2A) and 50B (FIG. 2B), the read data lines 52A, 52B are precharged. If the single data rate DR and DRB lines 52A, 52B are switching at a maximum rate, then the double data rate GDRB and Q data output line 60 (FIG. 1) would only switch at ½ the maximum rate. Conversely, if the DDR GDRB and Q data output line 60 are switching at maximum rate, then the SDR read data lines 52A, 52B are also switching because they are precharged. This is also true with respect to the corresponding "write" signals DL, DLB, GDW and D and is an artifact of how the single data rate internal data lines relate to the double data rate internal and external signal lines.

With reference specifically to FIG. 2C, a further representative implementation of a local read data driver 50C is shown. The local read data driver 50C comprises a series connected string comprising P-channel transistor 132 with N-channel transistors 134, 136 coupled between VCC and circuit ground. A similar string comprising P-channel transistor 138 with N-channel transistors 140, 142 is also coupled between VCC and circuit ground. Transistors 132, 134, 136, 138, 140, and 142 form an input circuit portion of local read data driver 50C. The common connected gate terminals of transistors 132 and 134 are coupled to the node intermediate transistors 138 and 140 as well as to DRL line 44A. The gate terminals of transistors 136 and 142 are coupled to REN line 54 while the common connected gate terminals of transistors 138 and 140 are coupled to the node intermediate transistors 132, 134 and to the DRLB line 44B.

The DRLB line 44B is also coupled to the input of a pair of CMOS transmission gates 144 and 146 which each have the gate of their respective P-channel device coupled to RENB line 102 and the gate of their respective N-channel device coupled to REN line 54. A P-channel transistor 148 is coupled between VCC and the output of transmission gate 144 with its gate terminal coupled to REN line 54. Series connected P-channel transistor 150 and N-channel transistor 152 are coupled between VCC and circuit ground, with the node between them coupled to DR line 52A. The gate terminal of transistor 150 is coupled to the output of transmission gate 144 while the gate terminal of transistor 152 is coupled to the output of transmission gate 146. Transistors 148, 150, 152, and 154 form an output circuit portion of local read data driver 50C. An N-channel transistor 154 is coupled between the output of transmission gate 146 and circuit ground and has its gate terminal coupled to REN line 102.

With respect to this implementation of a local read data driver 50C, the read data lines 52A, 52B (DR and DRB) do not need to be precharged. Further, a single-ended output DR 52A is provided which, because it is driven to a level of VCC, may be less power efficient. Other potential disadvantages are that a relatively large P-channel transistor 150 is coupled to DR line 52A which serves to add capacitance and a comparatively large number of active devices is required to implement the design increasing the amount of on-chip area required for its layout.

With reference specifically to FIG. 2D, yet another representative implementation of a local read data driver 50D is shown. The local read data driver 50D includes a pair of series connected transistor pairs comprising N-channel transistors 172, 174 and 176, 178 coupled between VCC and circuit ground. The gate terminal of transistor 172 is coupled to the gate terminal of transistor 178 while the gate terminal of transistor 174 is coupled to the gate terminal of transistor 176. An N-channel transistor 180 couples the gate terminal of transistor 174 to circuit ground and has its gate terminal coupled to the gate terminal of transistor 178. Correspondingly, another N-channel transistor 182 couples the gate terminal of transistor 178 to circuit ground and has its gate terminal coupled to the gate terminal of transistor 174. Transistors 172, 174, 176, 178, 180, and 182 form a cross-coupled circuit portion of read data driver 50D.

The DRLB line 44B and the DRL line 44A are respectively coupled to the gate terminals of transistors 174 and 178 as well as to one terminal of N-channel transistors 184 and 186 respectively. The opposite terminals of transistors 184 and 186 are coupled to circuit ground and their gate terminals are common connected to receive the RENB signal on line 54.

The local read data driver 50D is a preferred implementation and provides DR and DRB signals on lines 52A, 52B which have a logic "low" level of VSS and a "high" level of VCC-Vt. Power is thereby saved because the logic "high" level is not a full VCC. Furthermore, the DR and DRB lines 52A, 52B are not precharged. This enables DR and DRB lines 52A, 52B to stay at one data state until the actual "read" data from the sense amplifier 20 changes. As previously noted, this is also a power savings exhibited by the local read data driver 50B (FIG. 2B).

In a "read" operation, the signals YRB and RENB go "low". Either of DRL or DRLB lines 44A, 44B is pulled "high" by the P-channel device read amplifier 34 associated with the selected sense amplifier 20. Either transistors 172 and 178 or transistors 174 and 176 turn "on" pulling DR line 52A "high" and DRB line 52B "low" or DR line 52A "low" and DRB line 52B "high". After the "read" operation, the signals YRB and RENB again go "high" and DRL and DRLB lines 44A, 44B are pulled "low". This then turns off the transistors 172, 174, 176 and 178 allowing the read data lines 52A, 52B to "float".

Figure 3A:
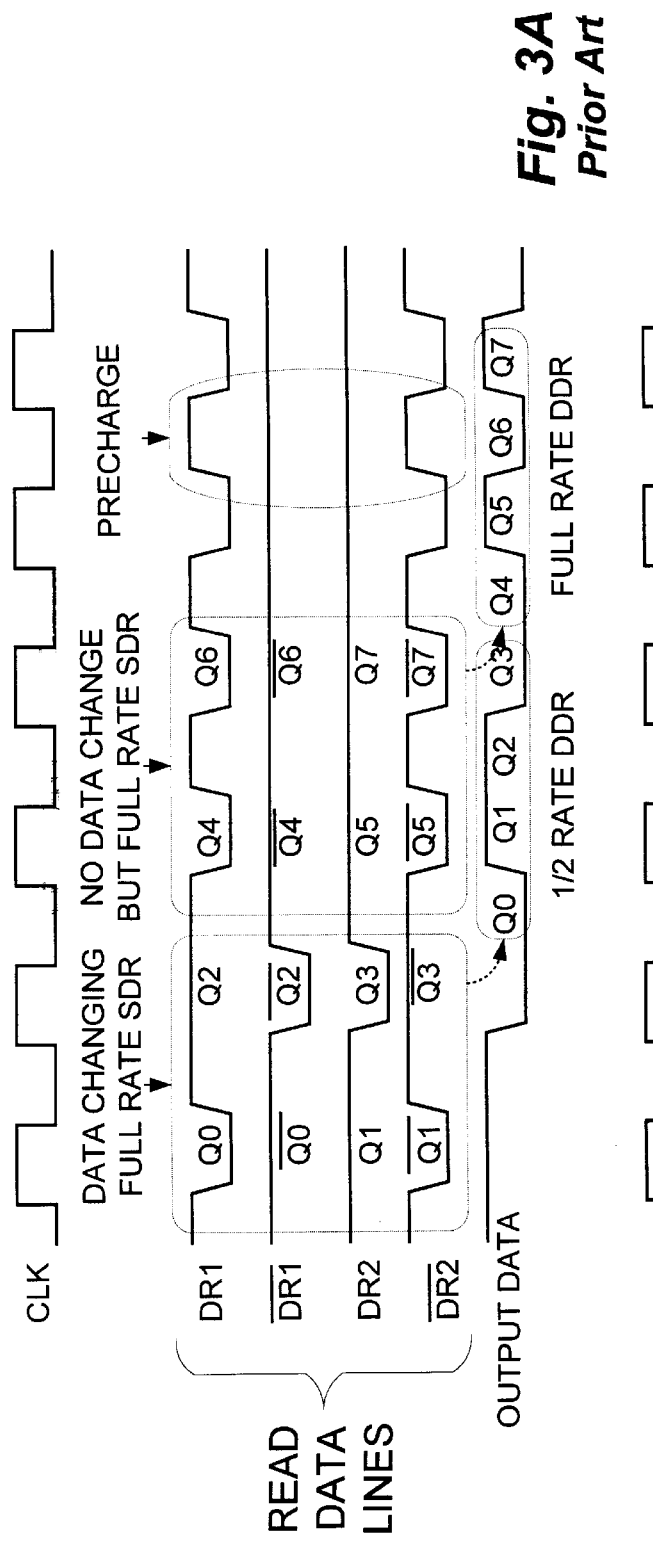
FIG. 3A illustrates a timing diagram of certain signals in a prior art implementation of a memory device read data circuit including complementary read data lines and indicating that certain of the read data lines continue to switch during a memory array precharge operation.

With reference additionally now to FIG. 3A, the following signals relating to a prior art read data path are shown: CLK (input to memory device), and internal read data lines DR1, DR1B, DR2, DR2B, and the output data signal designated OUTPUT DATA. The read data lines change data state a maximum of once per clock cycle. The output data signal OUTPUT DATA changes data state a maximum of twice per clock cycle. The output data signal is the combination of data from data lines DR1 and DR2, which are two separate sets of read data lines in the memory, one pair of which is shown in FIGS. 1 and 2A–2D. The read data lines DR1, DR1B, DR2, and DR2B are precharged every clock cycle as is shown in FIG. 3A.

For double-data rate (DDR) memories, where the output data signal changes at up to twice the clock frequency, there are two unique data patterns that present "worst case" power consumption conditions. These data patterns are shown in FIG. 3A and designated "DATA CHANGING FULL RATE SDR" and "NO DATA CHANGE BUT FULL RATE SDR". During the first data pattern, the output data signal changes at one-half the maximum rate. During the second data pattern, the output data signal changes at the maximum rate. Note that during the second data pattern, the data on the read data lines is not changing (0→0, 1→1), but the DR1 and DR2 lines are still switching at the maximum rate due to the precharge of the data lines every clock cycle.

Figure 3B:
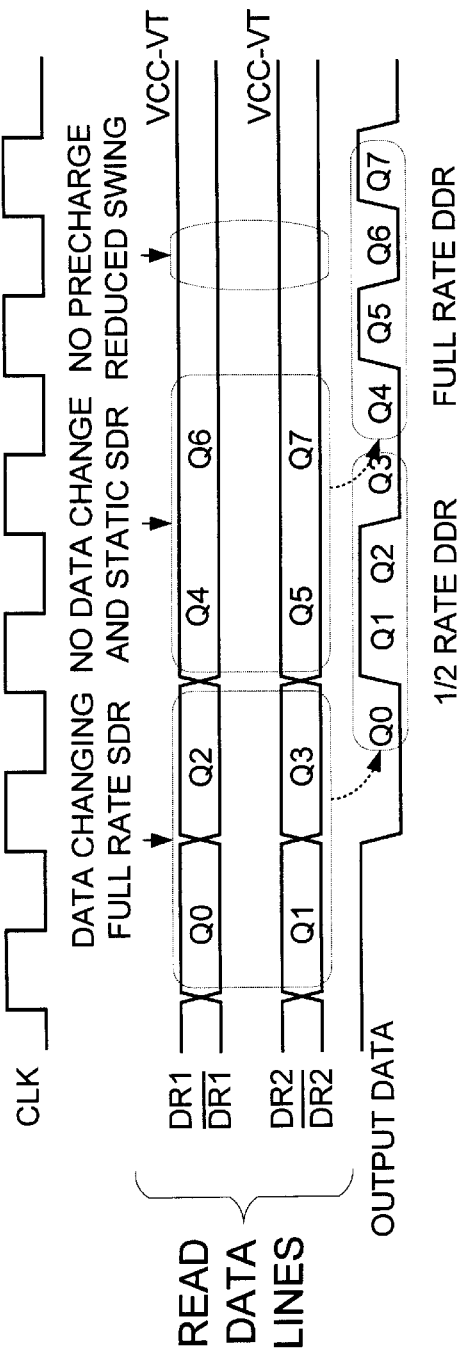
FIG. 3B illustrates the corresponding signals in an implementation of a memory device read data circuit in accordance with the present invention wherein reduced signal swing is thereby provided on the non-precharged complementary read data lines.

Referring now to FIG. 3B, the same set of signals are shown as in previous FIG. 3A, but using the local read data driver of FIG. 2D, without precharge of the read data lines, according to the present invention. Again, the same two data patterns are shown labeled "DATA CHANGING FULL RATE SDR" and "NO DATA CHANGE AND STATIC SDR". During the first data pattern the read data lines are still switching at the maximum rate even though they are not precharged. The output data signal is switching at one-half the maximum rate. Power consumption in this case is the same as in FIG. 3A. However, in the second data pattern, which is the worst case for power consumption, none of the read data lines switch because there is no precharge and the data state does not change. Therefore, the maximum power consumption is dramatically reduced.

With reference additionally now to FIG. 3B, the corresponding signals in an implementation of a memory device read data circuit in accordance with the present invention are illustrated when utilizing a local read data driver 50D as shown in FIG. 2D. The local read data driver 50D reduces power requirements by reducing signal swing and capacitance and also serves as a low impedance buffer between the read amplifier 34 (FIG. 1) and the read data lines. As can be seen, in this instance there is a reduced signal swing on the DR and DRB (even/odd) lines of between Vss and VCC-Vt and the complementary read data lines are not precharged which is important because, when the DDR data lines are switching at full rate, the SDR data lines are not switching.

While there have been described above the principles of the present invention in conjunction with specific integrated circuit devices and circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A read data path for a dynamic random access memory comprising:
    a pair of read data lines;
    a pair of local read data lines;
    a pair of bit lines;
    a pair of latched bit lines;
    a read amplifier coupled between the pair of local read data lines and the pair of latched bit lines;
    a sense amplifier coupled between the pair of latched bit lines; and
    a local read data driver coupled between at least one of the read data lines and the local read data lines.

2. A read data path as in claim 1 in which the read amplifier comprises:
    first and second P-channel transistors each having a gate and a current path serially coupled between VCC and a first of the pair of local read data lines; and
    third and fourth P-channel transistor each having a gate and a current path serially coupled between VCC and a second of the pair of local read data lines,
    wherein the gates of the first and third transistors are coupled together to receive a control signal, and the gates of the second and fourth transistors are coupled to the latched bit lines.

3. A read data path as in claim 1 in which the sense amplifier comprises:
    a P-channel transistor having a gate for receiving a first control signal;
    a cross-coupled latch; and
    an N-channel transistor having a gate for receiving a second control signal,
    wherein the P-channel transistor, cross-coupled latch, and N-channel transistor include serially coupled current paths coupled between VCC and ground.

4. A read data path as in claim 1 in which the local read data driver comprises:
    a first N-channel transistor having a gate and a current path coupled between a first of the pair of read data lines and a first of the pair of local read data lines;
    a second N-channel transistor having a gate and a current path coupled between a second of the pair of read data lines and a second of the pair of local read data lines,
    wherein the gates of the first and second N-channel transistors are coupled together to receive a first control signal; and
    a third N-channel transistor having a current path coupled between the pair of local read data lines and a gate for receiving a second control signal.

5. A read data path as in claim 1 in which the local read data driver comprises:
    a first P-channel transistor having a gate and a current path coupled between a first of the pair of read data lines and a first of the pair of local read data lines;

a second P-channel transistor having a gate and a current path coupled between a second of the pair of read data lines and a second of the pair of local read data lines;

an N-channel transistor having a gate and a current path coupled between the pair of local read data lines and a gate for receiving a second control signal, wherein the gates of the first P-channel, second P-channel, and N-channel transistors are coupled together to receive a control signal.

6. A read data path as in claim 1 in which the local read data driver comprises:

an input circuit coupled between the pair of local read data lines and further including an input for receiving a control signal;

an output circuit having first and second inputs and an output coupled to one of the pair of read data lines;

a first transmission gate coupled between one of the pair of local read data lines and the first input of the output circuit; and a second transmission gate coupled between one of the pair of local read data lines and the second input of the output circuit.

7. A read data path as in claim 1 in which the local read data driver comprises:

a cross-coupled transistor circuit having a first pair of nodes coupled to the pair read data lines, and a second pair of nodes coupled to the pair of local read data lines;

a first N-channel transistor having a gate and a current path coupled between a first of the pair of local read data bit lines and ground; and a second N-channel transistor having a gate and a current path coupled between a second of the pair of local read data bit lines and ground, wherein the gates of the first and second N-channel transistors are coupled together for receiving a control signal.

8. A read data path as in claim 1 in which the local read data driver comprises means for providing a reduced logic voltage swing.

9. A read data path as in claim 8 in which the reduced voltage swing traverses between ground voltage and a threshold voltage below the supply voltage level.

10. A read data path for a dynamic random access memory comprising:

a pair of read data lines;

a pair of local read data lines; and a local read data driver having an input coupled to at least one of the local read data lines, a tri-state output coupled to at least one of the read data lines, an input circuit coupled between the pair of local read data lines and further including an input for receiving a control signal, an output circuit having first and second inputs and an output coupled to one of the pair of read data lines, a first transmission gate coupled between one of the pair of local read data lines and the first input of the output circuit, and a second transmission gate coupled between one of the pair of local read data lines and the second input of the output circuit.

11. A read data path as in claim 10 in which the local read data driver comprises means for providing a reduced logic voltage swing.

12. In a read data path for a dynamic random access memory including a pair of read data lines, a pair of local read data lines, a pair of bit lines, a pair of latched bit lines, a read amplifier coupled between the pair of local read data lines and the pair of latched bit lines, and a sense amplifier coupled between the pair of latched bit lines, a method for driving the read data lines comprising:

driving a signal on the local read data lines onto the read data lines;

selectively electrically isolating the local read data lines from the read data lines; and limiting the output voltage swing on the read data lines to a threshold voltage less than the power supply voltage level.

13. A read data path for a dynamic random access memory comprising:

a pair of read data lines;

a pair of local read data lines; and a local read data driver having an input coupled to at least one of the local read data lines, a tri-state output coupled to at least one of the read data lines, and means for providing a reduced logic voltage swing.

14. A read data path as in claim 13 in which the reduced voltage swing traverses between ground voltage and a threshold voltage below the supply voltage level.

* * * * *